United States Patent
Ishikawa et al.

(10) Patent No.: US 6,231,677 B1
(45) Date of Patent: *May 15, 2001

(54) PHOTORESIST STRIPPING LIQUID COMPOSITION

(75) Inventors: Norio Ishikawa; Masanori Suga; Kiyoto Mori, all of Saitama-ken (JP)

(73) Assignee: Kanto Kagaku Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/255,537

(22) Filed: Feb. 22, 1999

(30) Foreign Application Priority Data

Feb. 27, 1998 (JP) .................................................. 10-062031

(51) Int. Cl.⁷ ................................ C23G 1/02; C23G 3/02
(52) U.S. Cl. ................................. 134/3; 134/1.3; 134/2; 134/41; 510/175; 510/176
(58) Field of Search ..................................... 510/175, 176; 134/2, 3, 4, 40, 41, 42, 1.3; 438/9, 725, 710, 706, 700; 252/186.1

(56) References Cited

U.S. PATENT DOCUMENTS

| | | | |
|---|---|---|---|
| 4,452,643 | * 6/1984 | Martin et al. ............................ | 134/3 |
| 5,334,332 | 8/1994 | Lee ....................................... | 252/548 |
| 5,480,585 | 1/1996 | Shiotsu et al. ......................... | 252/544 |
| 5,567,574 | 10/1996 | Hasemi et al. ......................... | 430/331 |
| 6,080,709 | * 6/2000 | Ishikawa et al. ...................... | 510/175 |

FOREIGN PATENT DOCUMENTS

| | | |
|---|---|---|
| 04209865A1 | * 9/1993 | (DE) . |
| 0 662 705 | 7/1995 | (EP) . |
| 0 773 480 | 5/1997 | (EP) . |
| 0812011A2 | * 10/1997 | (EP) . |
| 0 827 188 | 3/1998 | (EP) . |
| 1603558 | * 5/1971 | (FR) . |
| 2 455 075 | 11/1980 | (FR) . |
| 2 455 076 | 11/1980 | (FR) . |
| 2026550 | * 2/1980 | (GB) . |
| 5-281753 | 10/1993 | (JP) . |
| 7-201794 | 8/1995 | (JP) . |
| 08222574 | 8/1996 | (JP) . |
| 8-262746 | 10/1996 | (JP) . |
| 10256210 | 9/1998 | (JP) . |
| 1070210 | * 1/1984 | (SU) . |
| WO98/00244 | 1/1998 | (WO) . |
| WO98/45399 | 10/1998 | (WO) . |

* cited by examiner

Primary Examiner—Yogendra Gupta
Assistant Examiner—Gregory E. Webb
(74) Attorney, Agent, or Firm—Darby & Darby

(57) ABSTRACT

A photoresist stripping liquid composition effective for removing resist residues after dry etching and resist ashing in the manufacturing processes of semiconductor devices, which does not corrode the different metallic materials, and wherein are comprised, as active component, one or more polycarboxylic acids and/or their salts selected from the group consisting of aliphatic polycarboxylic acids and their salts as well as aminopolycarboxylic acids and their salts.

2 Claims, No Drawings

PHOTORESIST STRIPPING LIQUID COMPOSITION

FIELD OF THE INVENTION

The present invention relates to a photoresist stripping liquid composition, and more specifically relates to a photoresist stripping liquid composition for removing resist residues remaining after dry etching insulating films, wiring materials, capacitors and electrode materials in the manufacture of semiconductor devices.

BACKGROUND OF THE INVENTION

Dry etching is the most important technology for patterning insulating films, wiring materials, etc. in the manufacture of semiconductor devices. In the dry etching process a pattern is formed on a substrate, deposited by sputtering, CVD, spin coating, etc., by applying, exposing and developing a photoresist; after which the insulating film and the wiring pattern are formed by dry etching using a reactive gas and said photoresist as mask. After this patterning, ashing is performed, and the resist residues, which still remain in part after the photoresist used as mask has been removed by ashing, are typically removed by a stripping liquid.

However, the photoresist residues which remain after dry etching cannot be completely removed by the combination of an organic solvent with alkanolamine generally used as conventional stripping liquid (e.g., JP, A, 5-281753; U.S. Pat. No. 5,480,585). It is thought that the reason for this is that, together with the etched material, part of the resist residues remaining after ashing becomes inorganic. Therefore, stripping liquids containing fluorine compounds (JP, A, 7-201794; EP, A, 662705), hydroxylamine (U.S. Pat. No. 5,334,332) and quarternary ammonium compounds (JP, A, 8-262746; U.S. Pat. No. 5,567,574) have been proposed for removing photoresist residues after dry etching. However, since these stripping liquids corrode the wiring material, it is necessary to rinse with isopropyl alcohol or another organic solvent and to perform the treatment at a high temperature to remove resist residues completely.

Moreover, the impact of organic compounds on the environment has to be taken into consideration, since these stripping liquids are prepared from some 10% to 100% of organic compounds and since rinsing with organic solvents is also necessary.

On the other hand, together with the diversification of materials used for semiconductor devices in recent years, brought about by the use of new metallic materials such as barrier metals, ferroelectrics, etc. as wiring materials, etc., a diversification of the contents of the photoresist residue remaining after dry etching has also taken place. What is required of the removing liquid is that it be effective in removing photoresist residues and that it does not corrode the surrounding materials.

Also, the use of the before-mentioned fluorine compounds and inorganic acids is subject to limitation, since they possess the characteristic of etching lead zirconium titanate (PZT), which is a ferroelectric material. Moreover, removing methods using strongly alkaline liquids, such as tetramethylammoniumhydroxide (TMAH), etc., have also been proposed (JP, A, 8-222574); however, alkaline liquids cannot be used with titanium nitride, one of the barrier metals which is easily etched on the alkaline side, nor with hydrogen silsesquioxane (HSQ), which recently received much attention as interlayer insulating film because of its low dielectric constant, since there is the danger of film degradation (increase of the dielectric constant when the Si—H group changes to Si—OH). I.e., TMAH cannot be used with semiconductor devices in which PZT occurs together with titanium nitride or HSQ.

Thus, considering that the stripping liquids of the prior art are limited depending on their intended purpose, there is a need in the future for combining stripping liquids corresponding to the properties of the different materials used in the manufacturing processes of semiconductor devices. Therefore, when treating laminated films in which different materials are stacked, a different stripping liquid tank is required for each material; however, from the point of view of the manufacturing processes, production line planning and operating costs, this is a very negative factor.

Moreover, a related invention is mentioned in JP, A, 10-256210; however, the publication date of this application is Sep. 25, 1998, which is after the filing date of Feb. 27, 1998 of Japanese Patent Application Hei. 10-62031 which is the application on which the priority rights of the present application are based.

OBJECT OF THE INVENTION

Accordingly, the present invention provides a stripping liquid composition which is excellent for removing photoresist residues remaining after dry etching in the manufacturing processes of semiconductor devices using different metallic materials, does not corrode wiring materials, etc. and can be rinsed with water.

SUMMARY OF THE INVENTION

The inventors of the present invention, as a result of having made diligent efforts to achieve this object, accomplished the present invention by discovering that a stripping liquid comprising aliphatic polycarboxylic acids and their salts or aminopolycarboxylic acids and their salts on their own or in combination is excellent for removing photoresist residues, does not corrode metallic materials such as wiring materials, barrier metals, etc. and can be rinsed with water after treatment.

I.e., the present invention relates to the above-mentioned photoresist stripping liquid composition comprising, as active component, one or more polycarboxylic acids and/or their salts selected from the group consisting of aliphatic polycarboxylic acids and their salts as well as aminopolycarboxylic acids and their salts.

Through the present invention, it has been possible to provide a photoresist stripping liquid composition which is far more effective for removing photoresist residues remaining after dry etching than the stripping liquids of the prior art, does not corrode metallic materials and does not have an impact on the environment caused by organic solvents.

One embodiment of the present invention is a photoresist stripping liquid composition comprising, as active component, one or more aliphatic polycarboxylic acids and/or their salts selected from the group consisting of oxalic acid, malonic acid, tartaric acid, malic acid, succinic acid and citric acid.

Another embodiment of the present invention is a photoresist stripping liquid composition comprising, as active component, one or more aminopolycarboxylic acids and/or their salts selected from the group consisting of ethylenediaminetetraacetic acid, ethylenediaminetetraacetic acid diammonium salt or N-(2-hydroxyethyl)-N,N',N'-ethylenediaminetriacetic acid.

Still another embodiment of the present invention relates to the use of a photoresist stripping liquid composition according to the present invention for removing resist residues from wiring material made of Al—Si—Cu or from ferroelectrics made of lead zirconium titanate (PZT).

Yet another embodiment of the present invention relates to the use of a photoresist stripping liquid composition according to the present invention for removing deposited polymers after ashing treatment.

One more embodiment of the present invention is one of the above-mentioned photoresist stripping liquid compositions not comprising any organic solvents.

DETAILED DESCRIPTION OF THE PREFERRED EMBODIMENTS

The below is to explain the embodiments of the present invention in greater detail and is not intended to limit the scope of the invention.

As preferred aliphatic polycarboxylic acids used in a stripping liquid according to the present invention dicarboxylic acids such as oxalic acid, malonic acid and succinic acid; and dicarboxylic or tricarboxylic acids having a hydroxyl group such as tartaric acid, malic acid and citric acid can be mentioned. Further, the salts of the aliphatic polycarboxylic acids can also be used; however, in the manufacture of semiconductor devices, where metallic salts are not desirable, ammonium salts are typically used. As aminopolycarboxylic acids and their salts, compounds of ethylenediaminetetraacetic acid (EDTA), ethylenediaminetetraacetic acid diammonium salt, trans-1,2-cyclohexanediaminetetraacetic acid (CyDTA), nitrilotriacetic acid (NTA), diethylenetriaminepentaacetic acid (DTPA), N-(2-hydroxyethyl)-N,N',N'-ethylenediaminetriacetic acid (EDTA-OH), etc. and their salts can be mentioned. As aliphatic polycarboxylic acids, compounds of oxalic acid and malonic acid are particularly preferred because they have excellent removing properties at low temperature.

These aliphatic polycarboxylic acids are different from hydrochloric acid and other inorganic acids in that they have very little corrosive effect on metal; also it is thought that the reason why they possess excellent solubilizing power in regard to metal oxides is that they have 2 or more carboxylic groups. The photoresist residues remaining after dry etching are mainly oxides produced during ashing by oxygen plasma treatment of the reaction products which are produced during etching between the wiring material etc. and the gas; therefore, these photoresist residues, which are mainly oxides, can be advantageously removed by the use of polycarboxylic acids and their salts.

The concentration of aliphatic polycarboxylic acids or their salts is in the range between 0.01 wt % and 30 wt %, and preferably between 0.1 wt % and 10 wt %. On the other hand, the concentration of aminopolycarboxylic acids or their salts is in the range between 0.0001 wt % and 10 wt %, and preferably between 0.001 wt % and 1 wt %. The concentration of aliphatic polycarboxylic acids and aminopolycarboxylic acids is determined in consideration of the desired stripping power, the economy of use and whether or not crystallization takes place.

Aliphatic polycarboxylic acids and aminopolycarboxylic acids can be used on their own or in combination of a plurality thereof. In particular, oxalic acid exhibits excellent removing properties on its own; but a stripping liquid in which oxalic acid is combined with ethylenediaminetetraacetic acid has even better stripping power, and since it can be used at low temperatures, it is a preferred embodiment of the present invention.

The stripping liquids of the present invention, whose object is the removal of the residues remaining after dry etching, are basically used as an aqueous solution. Before ashing or after partial ashing, it is also possible to use the stripping liquids of the present invention in combination with dimethylsulfoxide, N-methyl-2-pyrrolidinone, diethyleneglycol dimethyl ether, dimethylimidazolidinone, or other water soluble organic solvents, prepared in any ratio according to the intended purpose; however, in consideration of the environment and also from the point of view of the removing properties, it is preferred not to include organic solvents. This can especially be said regarding the removal of resist residues remaining after ashing treatment.

The present invention can be applied to photoresist residues on wiring materials, ferroelectrics, electrode materials, barrier metals, etc. that have been treated by etching, ashing, etc.; however, it is most effective in removing sidewall polymers after ashing treatment. The photoresist stripping liquid composition of the present invention can be applied to a wide range of metallic materials including Al—Si—Cu, Al—Cu, W and other wiring materials, lead zirconium titanate (PZT), lead lanthanum zirconium titanate (PLZT), strontium bismuth tantalate (SBT) and other ferroelectrics, iridium, iridium oxide, ruthenium, ruthenium oxide and other electrode materials; and, without intending to limit its use, it is particularly suitable for removing resist residues from wiring materials made of Al—Si—Cu and ferroelectrics made of lead zirconium titanate (PZT).

Moreover, aliphatic carboxylic acids with only one carboxylic group, such as formic acid, acetic acid, etc. and aromatic polycarboxylic acids such as phthalic acid, etc. do not exhibit any properties for removing photoresist residues.

The examples and comparative examples given next are to explain the present invention in even greater detail and are not intended to limit the scope of the invention.

1) Stripping liquid evaluation test 1 (Al—Si—Cu wiring)

The resist residues on a silicon wafer or on an Al—Si—Cu wiring pattern formed on a silicon wafer by dry etching with a photoresist as mask were treated, after removal of the resist by oxygen plasma, for 20 min. at different temperatures with the stripping liquids shown in Tables 1 and 2; and the Al—Si—Cu corrosion and the removal of the photoresist residues were examined by means of an electron microscope after rinsing (with isopropyl alcohol and/or water) and drying. The results are shown in Table 3.

TABLE 1

Composition of the Comparative Examples

| Comparative Example | Stripping liquid | Rinsing |
|---|---|---|
| 1 | Stripping liquid 105 (manufactured by Tokyo Ohka Kogyo Co., Ltd.) | 2 times with isopropyl alcohol, water |
| 2 | Stripping liquid 105 (manufactured by Tokyo Ohka Kogyo Co., Ltd.) | water only |
| 3 | aqueous solution of 3.4 wt % acetic acid | water only |
| 4 | aqueous solution of 3.4 wt % formic acid | water only |

TABLE 2

Composition of Examples

Stripping liquid composition (wt %)

| Example | Aliphatic polycarboxylic acids | | Water | Dimethyl-sulfoxide |
|---|---|---|---|---|
| 1 | 3.4 | Oxalic acid | 96.6 | |
| 2 | 3.4 | Malonic acid | 96.6 | |
| 3 | 3.4 | Succinic acid | 96.6 | |
| 4 | 3.4 | Tartaric acid | 96.6 | |
| 5 | 3.4 | Malic acid | 96.6 | |
| 6 | 3.4 | Citric acid | 96.6 | |
| 7 | 3.4 | Ammonium oxalate | 96.6 | |
| 8 | 0.34 | Oxalic acid | 99.66 | |
| 9 | 3.4 | Oxalic acid | 96.59 | |
|   | 0.01 | ethylenediaminetetraacetic acid diammonium salt | | |
| 10 | 1.36 | Oxalic acid | 38.64 | 60.0 |
| 11 | 3.0 | Malonic acid | 27.0 | 70.0 |

TABLE 3

| Temp. | Resist residues removal | | | | | | | | Al—Si—Cu corrosion | | | | | | | |
|---|---|---|---|---|---|---|---|---|---|---|---|---|---|---|---|---|
| (° C.) | 20 | 25 | 30 | 40 | 50 | 60 | 70 | 80 | 20 | 25 | 30 | 40 | 50 | 60 | 70 | 80 |
| Comp. Example | | | | | | | | | | | | | | | | |
| 1 | — | — | — | — | — | X | X | X | — | — | — | — | — | O | O | O |
| 2 | — | — | — | — | — | X | X | X | — | — | — | — | — | X | X | X |
| 3 | — | — | — | — | — | X | X | X | — | — | — | — | — | O | O | O |
| 4 | — | — | — | — | — | X | X | X | — | — | — | — | — | O | O | O |
| Example | | | | | | | | | | | | | | | | |
| 1 | X | O | O | O | — | — | — | — | O | O | O | O | — | — | — | — |
| 2 | X | X | X | O | O | O | — | — | O | O | O | O | O | O | — | — |
| 3 | X | X | X | X | X | O | O | O | O | O | O | O | O | O | — | — |
| 4 | X | X | X | X | X | O | O | O | O | O | O | O | O | O | — | — |
| 5 | X | X | X | X | X | O | O | O | O | O | O | O | O | O | — | — |
| 6 | X | X | X | X | O | O | O | O | O | O | O | O | O | O | — | — |
| 7 | X | X | X | O | O | O | — | — | O | O | O | O | O | O | — | — |
| 8 | X | X | O | O | O | — | — | — | O | O | O | O | O | O | — | — |
| 9 | O | O | O | O | — | — | — | — | O | O | O | O | — | — | — | — |
| 10 | X | X | O | O | O | — | — | — | O | O | O | O | O | O | O | O |
| 11 | X | X | X | X | X | X | X | O | — | — | — | — | O | O | O | O |

Note:
Removing properties
O: removal of resist residues
X: no removal of resist residues
Al—Si—Cu corrosion
O: no corrosion
X: corrosion
—: no evaluation With conventional stripping liquids (Comparative Examples) the removal of the resist residues was incomplete, and corrosion, appearing as a result of the rinsing with water, was observed.

Monocarboxylic acids such as acetic acid and formic acids did not remove the resist residues. In contrast, the stripping liquid compositions related to the present invention, as can be seen from the different examples, exhibit good removal properties, and the oxalic acid stripping liquid exhibits good removing properties even when used at room temperature. Moreover, no corrosion of the wiring material was noted with any of these stripping liquids. (0019)

2) Stripping liquid evaluation test 2 (ferroelectric material: PZT)

A wafer, on which a lead zirconium titanate (PZT) pattern was dry etched with a photoresist as mask on Pt electrodes formed on a silicon wafer, was treated, after removal of the photoresist by oxygen plasma ashing, for 20 min. at different temperatures with the stripping liquids shown in Tables 4 and 5; and the PZT corrosion and the removal of the photoresist residues on the wafer surface were examined by means of an electron microscope after rinsing (with isopropyl alcohol and/or water) and drying. The evaluation results are compiled in Table 6.

TABLE 4

Composition of Comparative Examples

| Comparative Example | Stripping liquid | Rinsing |
|---|---|---|
| 5 | Stripping liquid 105 (manufactured by Tokyo Ohka Kogyo Co., Ltd.) | 2 times with isopropyl alcohol, water |
| 6 | ELM-C30 (manufactured by Mitsubishi Gas Chemical Company, Inc.) | water only |

TABLE 4-continued

Composition of Comparative Examples

| Comparative Example | Stripping liquid | Rinsing |
|---|---|---|
| 7 | aqueous solution of 3.4 wt % acetic acid | water only |
| 8 | aqueous solution of 3.4 wt % o-phthalic acid | water only |

TABLE 5

Composition of Examples

Stripping liquid composition (wt %)

| Example | Polycarboxylic acids / aminopolycarboxylic acids | | Water |
|---|---|---|---|
| 12 | 3.4 | Oxalic acid | 96.6 |
| 13 | 0.34 | Oxalic acid | 99.66 |
| 14 | 0.1 | ethylenediaminetetraacetic acid diammonium salt | 99.9 |
| 15 | 0.1 | N-(2-hydroxyethyl)-N,N',N'-ethylenediaminetriacetic acid | 99.9 |
| 16 | 3.4 | Oxalic acid | 96.59 |
|  | 0.01 | ethylenediaminetetraacetic acid diammonium salt |  |

Note: Only water was used for rinsing in the different Examples.

TABLE 6

| Temp. | Resist residues removal | | | | | | | PZT corrosion | | | | | | |
|---|---|---|---|---|---|---|---|---|---|---|---|---|---|---|
| (° C.) | 25 | 30 | 40 | 50 | 60 | 70 | 80 | 25 | 30 | 40 | 50 | 60 | 70 | 80 |
| Comp. Example | | | | | | | | | | | | | | |
| 5 | — | — | — | — | X | X | X | — | — | — | — | O | O | O |
| 6 | — | — | — | — | X | X | X | — | — | — | — | X | X | X |
| 7 | — | — | — | — | X | X | X | — | — | — | — | O | O | O |
| 8 | — | — | — | — | X | X | X | — | — | — | — | O | O | O |
| Example | | | | | | | | | | | | | | |
| 12 | X | O | O | — | — | — | — | O | O | O | — | — | — | — |
| 13 | X | X | X | O | O | — | — | O | O | O | O | O | — | — |
| 14 | X | X | X | X | X | O | O | O | O | O | O | O | O | O |
| 15 | X | X | X | X | X | O | O | O | O | O | O | O | O | O |
| 16 | O | O | O | — | — | — | — | O | O | O | — | — | — | — |

Note:
Removing properties
O: removal of resist residues
X: no removal of resist residues
Al—Si—Cu corrosion
O: no corrosion
X: corrosion
—: no evaluation As is clear from Table 6, it was not possible to remove the resist residues remaining after dry etching of a ferroelectric material (PZT) with conventional stripping liquids, monocarboxylic acids or aromatic carboxylic acids; but the stripping liquids related to the present invention effectively removed the resist residues without corroding the PZT. An effect was also noted with the combined use of polycarboxylic acids and aminopolycarboxylic acids.

What is claimed is:

1. A method for removing photoresist residues from wiring material made of Al—Si—Cu or from ferroelectrics made of lead zirconium titanate, the method comprising applying a photoresist stripping liquid composition comprising
   (a) oxalic acid or a salt thereof,
   (b) a solvent selected from the group consisting of water, an organic solvent, and any combination thereof, and
   (c) optionally, ethylenediaminetetraacetic acid or a salt thereof.

2. A method for removing deposited polymers on a substrate after ashing treatment, the method comprising applying a photoresist stripping liquid composition comprising
   (a) oxalic acid or a salt thereof,
   (b) a solvent selected from the group consisting of water, an organic solvent, and any combination thereof, and
   (c) optionally, ethylenediaminetetraacetic acid or a salt thereof.

* * * * *